US009542309B2

(12) United States Patent
Lasser

(10) Patent No.: US 9,542,309 B2
(45) Date of Patent: Jan. 10, 2017

(54) RELOCATING DATA BASED ON MATCHING ADDRESS SEQUENCES

(71) Applicant: SANDISK TECHNOLOGIES INC., Plano, TX (US)

(72) Inventor: Menahem Lasser, Kohav-Yair (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 13/972,246

(22) Filed: Aug. 21, 2013

(65) Prior Publication Data

US 2015/0058528 A1 Feb. 26, 2015

(51) Int. Cl.
*G06F 12/02* (2006.01)
*G11C 16/34* (2006.01)

(52) U.S. Cl.
CPC ....... *G06F 12/0246* (2013.01); *G11C 16/3427* (2013.01); *G11C 16/3431* (2013.01); *G11C 16/3495* (2013.01); *G06F 2212/1032* (2013.01); *G06F 2212/7202* (2013.01)

(58) Field of Classification Search
CPC ............. G06F 12/0246; G11C 16/3427; G11C 16/3431
USPC ........................... 711/103, E12.002; 707/824
See application file for complete search history.

(56) References Cited

U.S. PATENT DOCUMENTS 7,818,525 B1 10/2010 Frost et al.
8,051,249 B2 11/2011 Mosek et al.
8,452,937 B2 * 5/2013 Lieber et al. ................. 711/165
8,719,652 B2 * 5/2014 Mataya et al. ................ 714/745
2008/0181018 A1 7/2008 Nagadomi et al.
2009/0138754 A1 5/2009 Edwards et al.
2009/0193174 A1 7/2009 Reid
2009/0216936 A1 8/2009 Chu et al.
2010/0023675 A1 1/2010 Chen et al.
2010/0095070 A1 * 4/2010 Okawara ............ G06F 12/0862 711/137
2011/0040932 A1 * 2/2011 Frost et al. .................. 711/103
2012/0030506 A1 2/2012 Post et al.
2013/0191565 A1 * 7/2013 Tal ......................... G06F 3/061 710/74
2014/0103530 A1 4/2014 Lai et al.
(Continued)

OTHER PUBLICATIONS

Yang, Nian Niles et al. "Probability-Based Remedial Action for Read Disturb Effects," U.S. Appl. No. 13/802,140, filed Mar. 13, 2013, 25 pages.

(Continued)

*Primary Examiner* — Edward Dudek, Jr.
(74) *Attorney, Agent, or Firm* — Toler Law Group, PC

(57) ABSTRACT

A data storage device includes a non-volatile memory and a controller. The controller is configured to store a first sequence of addresses based on a first sequence of read instructions received from a host device. Subsequent to storing the first sequence of addresses, the controller is configured to receive a second sequence of read instructions from the host device and to determine whether a second sequence of addresses that is based on the second sequence of read instructions matches the first sequence of addresses. The controller is configured to relocate at least one page of the non-volatile memory at least partially based on the second sequence of addresses matching the first sequence of addresses.

36 Claims, 3 Drawing Sheets

(56) References Cited

U.S. PATENT DOCUMENTS

2014/0108705 A1 * 4/2014 Gorobets ........... G11C 16/3431
711/103

OTHER PUBLICATIONS

Non-Final Office Action mailed Aug. 7, 2014 in U.S. Appl. No. 14/285,389, 18 pages.
Notice of Allowance and Fee(s) Due mailed Dec. 10, 2014 in U.S. Appl. No. 14/285,389, 8 pages.

* cited by examiner

| Index | Count | Last Access | Last Refresh | Sequence |
|---|---|---|---|---|
| IA | CA | T1A | T2A | A1, A2, A3... |
| IB | CB | T1B | T2B | B1, B2, B3... |
| ⋮ | | | | |
| IM | CM | T1M | T2M | M1, M2, M3... |

RELOCATING DATA BASED ON MATCHING ADDRESS SEQUENCES

FIELD OF THE DISCLOSURE

The present disclosure is generally related to data storage and data integrity in non-volatile memory devices.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Flash memory devices may be subject to a condition called "read disturb" (RD). Read disturb is caused by reading a page of flash cells many times without refreshing the block containing the page. When a page is read from a block, voltages are applied to the word line corresponding to the page that is selected to be read and are also applied to word lines of the block that are not selected to be read. These applied voltages might cause unintentional programming effects in the word lines to which the voltages are applied, particularly in the non-selected word lines. When multiple read operations are performed (e.g., thousands or tens of thousands of read operations), some of the cells of the non-selected word lines might accumulate enough disturbances to cause a stored value to change. If the cells are single-level cells, then non-programmed cells might become programmed. If the cells are multi-level cells, then programmed cells might shift to a higher state and cause bit errors.

Read disturb effects may be particularly pronounced with regard to code stored in a storage device that is executed on every power-up or reset operation. Such code may include firmware code that is executed by a flash controller of the storage device in order to operate the storage device and may also include operating system (OS) code that is executed by a host that boots up from the storage device in order to initialize a host system. Read disturb effects may also be pronounced for code or data the host loads on every power-up or reset, even if the code or data is not formally part of the operating system. For example, in a consumer device that is dedicated to executing a single application, such as a multimedia player, the host may load a player application each time after loading the operating system code. As a result, the number of read operations and the severity of read disturb effects may be similar for blocks containing operating system code and for blocks containing application code (e.g., code of the player application).

Firmware code and operating system code (and potentially application code, such as a multimedia player application) are typically not re-written (or are re-written infrequently). As a result, physical blocks of a flash memory that store such code are typically not refreshed or replaced (or infrequently refreshed or replaced). Thus, the same few physical blocks containing such code may be accessed during each boot read operation throughout the device life.

RD effects for firmware boot code may become more significant as a result of power-saving procedures employed by processors of battery operated consumer devices, such as smart phones or cameras. Many such battery operated consumer devices attempt to extend battery life by shutting down the power to a storage device when there is no read or write activity required by the host device. The storage device is powered up in order to respond to new host commands (e.g., when the user touches a key or touches the screen). Every time the storage device is powered up the firmware boot code may be re-loaded, and read disturb effects may accumulate over time and may eventually reach a failure point. RD effects due to such power saving procedures may apply to controller firmware blocks and may not apply to operating system code blocks that are not re-loaded with every power-up of the storage device (unless the processor of the host is also powering up).

Even though flash devices may be able to withstand tens of thousands read cycles without losing data to read disturb effects, such robustness may not be sufficient to guarantee immunity from read disturb errors. For example, consumer devices may be subject to abnormal operation conditions (for example when being tested at the production facility), such as repeatedly powering up and powering down after a short time intervals. Power cycling during a short time interval may prevent an embedded storage device from detecting and refreshing blocks subject to a read disturb that would normally be detected and corrected during a background process (i.e., during a period of host inactivity during normal operation). As a result, heavy read disturb stress may be applied to blocks containing operating system code that might eventually lead to a boot failure.

Another case of potential read disturb risk is a consumer device with a limited amount of random access memory (RAM) when there is insufficient capacity in the RAM for all resident applications and possibly insufficient capacity in the RAM for all operating system code. Some blocks containing non-resident operating system modules (sometimes called "overlays" of the operating system) and some blocks containing frequently used applications may be re-loaded frequently, possibly dozens of times within a single power-up session. Such repeated re-loading of blocks during power-up accelerates accumulation of read disturb effects and could result in read disturb failures.

As described above, read disturb effects may be more severe for blocks read during the boot process than for blocks containing user code or data that is not read during the boot process. However, read disturb might also be a risk even for non-boot blocks, if the non-boot blocks contain code or data that is more frequently read than average blocks during normal host operation

SUMMARY

Read disturb effects may be reduced by identifying sequences of frequently read addresses and initiating a remedial action based on detecting when a host requests to read data from addresses of an identified sequence of addresses. For example, a data storage device may store a sequence of logical addresses, such as logical addresses of operating system code, overlays, and application code, that are requested from a host device in conjunction with boot events. The data storage device may track read instructions from the host device and compare requested read addresses to a stored sequence of logical addresses. The data storage device may initiate a remedial action, such as relocating data from an affected physical block to another physical block, based on one or more metrics associated with the logical addresses of the stored sequence. For example, the data storage device may relocate data based on a number of read operations or an elapsed time since a last relocation of the data. Multiple address sequences may be identified as frequently read addresses and may be stored for comparison to addresses of incoming read instructions.

DETAILED DESCRIPTION

Figure 1:
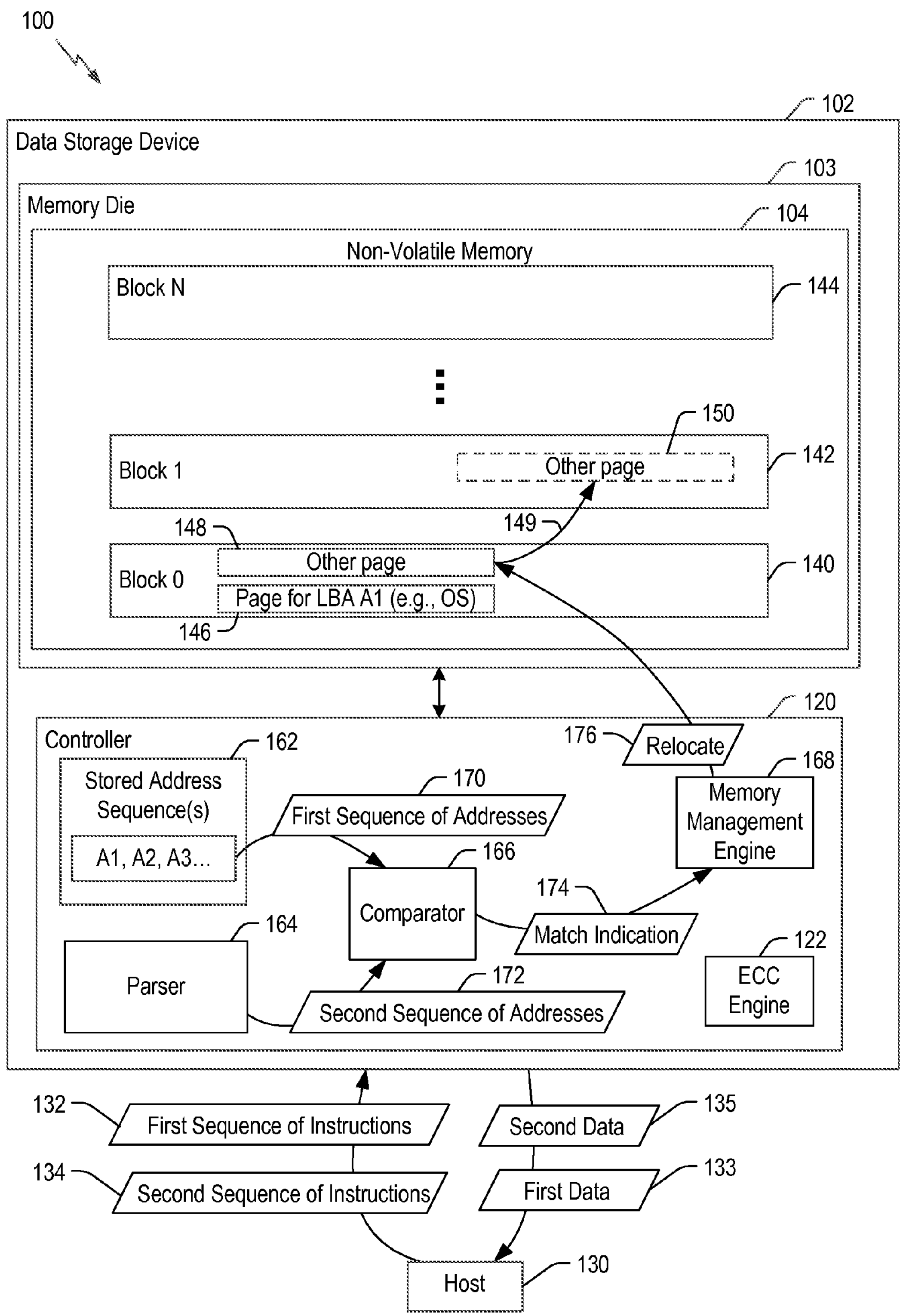
FIG. 1 is a block diagram of a particular illustrative embodiment of a system including a data storage device configured to relocate data based on matching address sequences.

Referring to FIG. 1, a particular embodiment of a system 100 includes a data storage device 102 coupled to a host device 130. The data storage device 102 is configured to detect and store an address sequence 162 corresponding to a relatively frequently requested sequence of read requests from the host device 130. The data storage device 102 is configured to relocate pages of a non-volatile memory 104 at least partially based on detecting that a sequence of addresses corresponding to read instructions from the host device 130 matches the stored address sequence 162. As a result, read disturb effects due to repeatedly reading data corresponding to the stored address sequence 162 are reduced.

The host device 130 may be configured to provide data to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the data storage device 102 and writing to the data storage device 102. For example, the host device 130 may operate in compliance with a Joint Electron Devices Engineering Council (JEDEC) industry specification, such as eMMC specification. As other examples, the host device 130 may operate in compliance with a USB or a Universal Flash Storage (UFS) specification. The host device 130 may communicate with the data storage device 102 in accordance with any other suitable communication protocol.

The data storage device 102 includes a memory die 103 that includes the non-volatile memory 104 and that is coupled to a controller 120. The non-volatile memory 104 may be a NAND flash memory. The non-volatile memory 104 includes multiple erase blocks such as a first block 140, a second block 142, and an Nth block 144. Each block 140-144 may include multiple word lines, and each word line may include multiple storage elements arranged to store data in one or more pages. For example, each block 140-144 may include multiple word lines of a multi-level cell (MLC) flash memory, each word line may include multiple physical pages, and each physical page may include multiple logical pages.

The data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may be a memory card, such as a Secure Digital SD® card, a microSD® card, a miniSD.™ card (trademarks of SD-3C LLC, Wilmington, Del.), a MultiMediaCard.™ (MMC.™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 includes an error correction coding (ECC) engine 122, the stored address sequence 162, a parser 164, a comparator 166, and a memory management engine 168. The ECC engine 122 is configured to receive data to be stored to the non-volatile memory 104 and to generate a codeword. For example, the ECC engine 122 may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder configured to decode data read from the non-volatile memory 104 to detect and correct, up to an error correction capability of the ECC scheme, any bit errors that may be present in the data.

The stored address sequence 162 may be stored in a controller memory, such as a RAM or one or more registers included in the controller 120 or that is accessible to the controller 120. In some implementations, a single stored address sequence 162 may be maintained by the controller 120. In other implementations, such as described with respect to FIG. 3, multiple stored address sequences 162 may be maintained by the controller 120. The stored address sequence(s) 162 may include a sequence of logical addresses that correspond to a sequence (or part of a sequence) of read instructions received from the host device 130. For example, the stored address sequence(s) 162 may correspond to addresses read by the host device 130 in response to a power-up event or a boot event, such as addresses for firmware code or operating system code. Alternatively, or in addition, the stored address sequence(s) 162 may correspond to addresses of pages that are read with relatively high frequency (as compared to an average read frequency of pages in the non-volatile memory 104) independent of whether the pages store firmware and/or operating system code. The stored address sequence(s) 162 may be provided by the controller 120 to an input of the comparator 166 for comparison to received read instruction addresses.

The parser 164 may be configured to receive a series of addresses corresponding to read instructions received from the host device 130 and to identify one or more sequences of addresses for comparison to the stored address sequence(s) 162. For example, as described with respect to FIG. 2, the parser 164 may be configured to detect a starting address of a sequence, such as by detecting a first address received after a boot event, and to detect an ending address of a sequence, such as by detecting a delay between sequential read commands that exceeds a threshold delay duration. The parser 164 may be configured to provide identified sequences of addresses to another input of the comparator 166 for comparison to the stored address sequence(s) 162.

The comparator 166 may be configured to compare one or more of the stored address sequence(s) 162 received at one input, such as a first sequence of addresses 170, to another address sequence received from the parser 164, such as a second sequence of addresses 172. In response to detecting a match between the two received address sequences, the comparator 166 may generate a match indication 174 that is provided to the memory management engine 168.

The memory management engine 168 is configured to manage functions associated with the non-volatile memory 104, such as sending write commands to store data to the non-volatile memory 104, read commands to read data from the non-volatile memory 104, and performing "housekeeping" operations. Examples of housekeeping operations include wear leveling, garbage collection, and other operations that may be performed during a period of non-user activity (e.g., during a background process).

The memory management engine 168 may be responsive to the match indication 174 indicating a match between a sequence of read addresses identified by the parser 164 and one of the stored address sequence(s) 162. Because the match indication 174 indicates read instructions from the host device 130 to be performed at frequently-read pages of the non-volatile memory 104, the memory management engine 168 may perform or schedule a remedial operation to reduce or remove read disturb effects that may result from reading the pages. For example, the memory management engine 168 may issue a relocate command 176 at least partially based on the match indication 174. The relocate command 176 may cause the non-volatile memory 104 to copy data from a page of a block that may be subject to read disturb to another block of the non-volatile memory 104. The relocate command 176 may cause the non-volatile memory 104 to perform a full copy operation where data read from the non-volatile memory 104 is transferred to the controller 120, provided to the ECC engine 122 for error correction, and an error-corrected version of the data is transferred back to the non-volatile memory 104 to be stored at the destination block. Alternatively, the relocate command 176 may cause the non-volatile memory 104 to perform a copy-back operation where data is copied within the memory die 103 without being transferred to the controller 120 for error correction.

During operation, the host device 130 may send a first set of instructions 132 to the data storage device 102 to read data from the non-volatile memory 104. For example, each instruction of the first set of instructions 132 may include a read instruction that identifies a logical address of a page to be read from the non-volatile memory 104. As another example, the first set of instructions 132 may include a first read instruction that includes or accompanies a logical address of a page to be read, followed by one or more sequential read instructions that do not include a logical address to be read. Instead, each sequential read instruction may instruct the data storage device 102 to read a page at a next sequential logical address following the immediately previous logical address requested to be read from the non-volatile memory 104. The controller 120 may generate a sequence of logical addresses requested for reading from the non-volatile memory 104 that corresponds to the first set of instructions 132.

The parser 164 may receive the sequence of logical addresses that corresponds to the first set of instructions 132 and may generate the first sequence of addresses 170. For example, as described with respect to FIG. 2, the parser 164 may identify a starting address of the first sequence of addresses 170 based on one or more criteria, such as following detection of a boot event, and may identify an ending address of the first sequence of addresses 170 based on one or more criterion, such as based on a sequence length threshold. The first sequence of addresses 170 generated by the parser 164 may be stored as part of the stored address sequence(s) 162.

The host device 130 may send a second set of instructions 134 to the data storage device 102 to read data from the non-volatile memory 104, such as described with respect to the first set of instructions 132. The parser 164 may generate the second sequence of addresses 172 based on the second set of instructions 134. The controller 120 may retrieve the first sequence of addresses 170 from the stored address sequence(s) 162 and transfer the first sequence of addresses 170 to the comparator 166 to be compared to the second sequence of addresses 172.

The comparator 166 may compare each address of the first sequence of addresses 170 to the corresponding address of the second sequence of addresses 172 to determine if the first sequence of addresses 170 matches the second sequence of addresses 172. For example, the first sequence of addresses 170 may be determined to match the second sequence of addresses 172 if each address in the first sequence of addresses 170 matches the corresponding address in the second sequence of addresses 172. To illustrate, in a particular embodiment, the first sequence of addresses 170 may be determined to match the second sequence of addresses 172 only if the first sequential address in the first sequence of addresses 170 (e.g., A1) matches the first sequential address in the second sequence of addresses 172, the second sequential address in the first sequence of addresses 170 (e.g., A2) matches the second sequential address in the second sequence of addresses 172, the third sequential address in the first sequence of addresses 170 (e.g., A3) matches the third sequential address in the second sequence of addresses 172, up to a last sequential address in the first sequence of addresses 170 matching the corresponding sequential address in the second sequence of addresses 172. As another example, in another embodiment, the first sequence of addresses 170 may be determined to match the second sequence of addresses 172 if a portion (e.g., a beginning portion) of the first sequence of addresses 170 matches the second sequence of addresses 172 or a beginning portion of it even if not all of the first sequence of addresses 170 matches the second sequence of addresses 172 (e.g., the two sequences match for a beginning portion but then diverge).

In response to determining that the first sequence of addresses 170 matches the second sequence of addresses 172, the match indication 174 may be provided to the memory management engine 168, such as via an interrupt signal or by setting a value in a register or other memory location accessible to the memory management engine 168. In response to the match indication 174, the memory management engine 168 may determine whether a remedial operation is to be performed (e.g., the relocate command 176). The remedial operation may be designed to reduce or to eliminate the accumulation of read disturb effects (e.g., threshold voltage shifts) of data at word lines in the same block as the read data. For example, when data is repeatedly read from a page of the non-volatile memory 104, such as a first page 146 that contains operating system code and corresponds to the logical block address (LBA) A1, data from a second page 148 in the same block as the first page 146 (e.g., the first block 140) may be at increased risk of read disturb errors due to accumulated threshold voltage shifts of storage elements caused by voltages applied to the word line of the second page 148 when the first page 146 is read. By relocating the data of the second page 148 to a third page 150 at another block (e.g., the second block 142), the accumulated threshold voltage shifts are removed and the data is not susceptible to further read disturb from reading the first page 146. In an implementation where the data of the second page 148 is transferred to the controller 120 prior to saving the data at the third page 150, error correction may be performed by the ECC engine 122 to correct bit values of storage elements whose threshold voltage shift had resulted in bit errors.

In some implementations, the memory management engine 168 may issue the relocate command 176 immediately in response to receiving the match indication 174. In other implementations, the memory management engine 168 may issue the relocate command 176 after a delay, such as by adding addresses of the second sequence of addresses 172 to a relocation queue to be performed during a period of relatively little activity from the host device 130, such as during a background process. However, the memory management engine 168 may impose a time limit that the relocate command 176 may be delayed and may issue the relocate command 176 even during a period of high activity from the host device 130 when the time limit has been reached. By ensuring the relocate command 176 is issued when the time limit has been reached due to a period of high activity, read disturb effects may be remedied even under circumstances where the host device 130 is operating abnormally (e.g., repeated power-up/power-down cycling during a short time interval).

In other implementations, the memory management engine 168 may determine to issue the relocate command 176 based on one or more other factors, such as based on a count indicating the number of times the data corresponding to the first sequence of addresses 170 has been read from the non-volatile memory 104 since a most recent read disturb remedial action has been performed. As another example, the memory management engine 168 may determine to read data from the affected block, such as the first block 140, and issue the relocate command 176 in response to a result of an ECC operation performed by the ECC engine 122 indicating that a count of errors in the read data exceeds an error threshold. The error threshold is less than the correction capability of the ECC scheme used to protect the data and may be set to enable detection and correction of accumulated bit errors due to read disturb effects prior to ECC failure.

In response to determining that a remedial action is to be performed, the memory management engine 168 may translate each logical address of the first sequence of addresses 170 into corresponding physical addresses, such as via a logical-to-physical address translation table. The memory management engine 168 may locate, for each physical address of the first sequence of addresses 170, one or more neighboring word lines that may be subject to read disturb and that therefore may be candidates for relocation to another block. The memory management engine 168 may issue a relocate command 176 for one or more (or all) pages of each identified neighboring word line or may add addresses of the pages to a relocation queue. For example, the memory management engine 168 may determine an address of a block that includes the physical address by parsing a high-order set of bits (e.g., 11 bits for a 2,048 block memory) of the physical address and using the high-order set of bits as the block address. After relocating each identified page, the memory management engine 168 may update the logical-to-physical address translation table to indicate the physical address of the relocated page.

Although the stored address sequence(s) 162 is described as being identified by the parser 164, such as in response to detecting a boot event, in other implementations one or more of the stored address sequence(s) 162 may be provided by other techniques. For example, one or more of the stored address sequence(s) 162 may be provided by a manufacturer of the data storage device 102, by firmware executed by the controller 120, by operating system code stored in the non-volatile memory 104, by the host device 130, or a combination thereof. The stored address sequence(s) 162 may be maintained as a table having entries that are tracked and updated, with new entries added and other entries removed, based on frequency of use and time since last access, such as described with respect to FIG. 3.

By relocating pages at least partially based on identifying that the first sequence of addresses 170 matches the second sequence of addresses 172, read disturb effects to pages sharing blocks with data corresponding to the first sequence of addresses 170 may be mitigated or eliminated prior to data loss. As a result, a reliability of stored data may be improved with fewer errors due to read disturb. The resulting improved reliability may enable longer operational life of the non-volatile memory 104.

Figure 2:
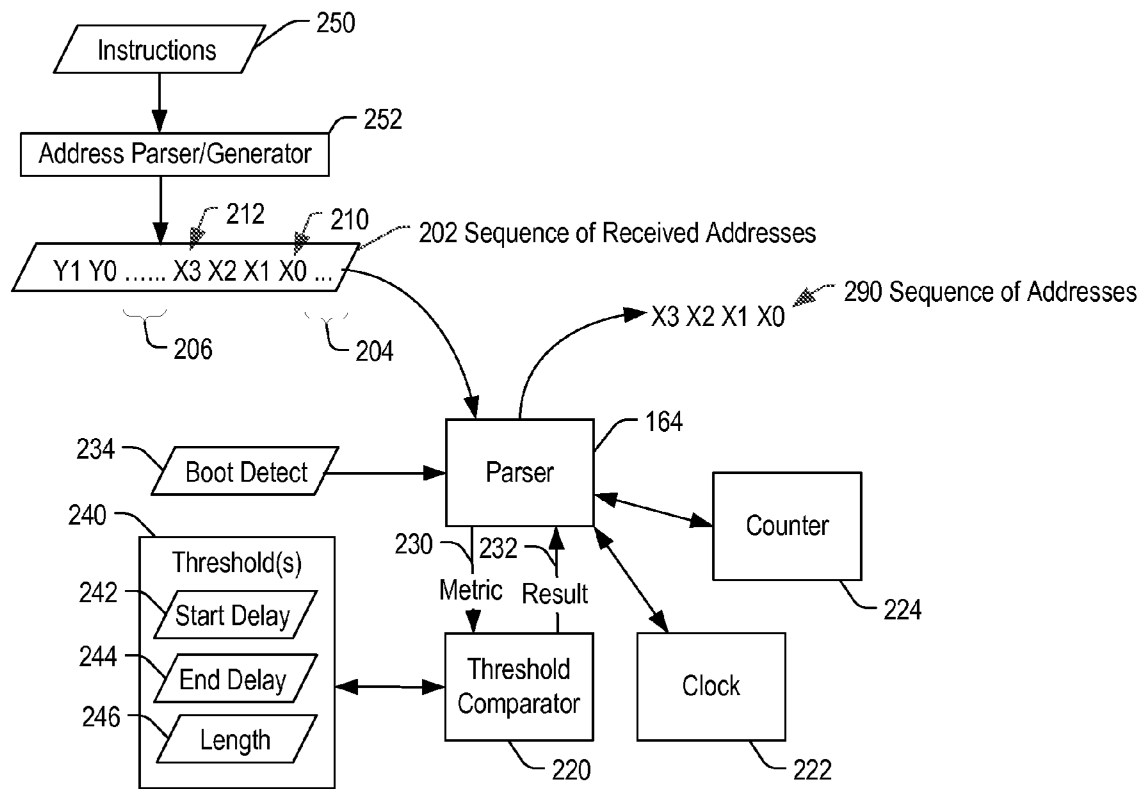
FIG. 2 is a block diagram illustrating a particular embodiment of components that may be incorporated in the data storage device of FIG. 1.

FIG. 2 depicts a particular embodiment of components that may be implemented in the controller 120 of FIG. 1. The parser 164 is coupled to receive a sequence of received addresses 202 from an address parser/generator 252. The parser 164 is also coupled to a threshold comparator 220, to a clock 222, and to a counter 224.

The address parser/generator 252 is configured to receive one or more sets of instructions 250, such as the first set of instructions 132 and/or the second set of instructions 134 of FIG. 1, and to generate a sequence of received addresses such as the sequence 202 of received addresses. For example, the address parser/generator 252 may be configured to parse one of the instructions 250 to detect and extract an address associated with the parsed instruction, such as a target address included in a read instruction. As another example, the address parser/generator 252 may be configured to generate addresses corresponding to instructions that do not include addresses. For example, the address parser/generator 252 may include an address counter that is set each time an address is received in the instructions 250 and that is incremented to a next address to accommodate sequential read instructions. For example, if a read instruction designates a target address of X0, followed by three "read next address" instructions that do not designate a target address, the address counter may be set to X0 in response to the read instruction and incremented to addresses X1, X2, and X3 for each of the following "read next address" instructions. The address counter may be incremented by a page size (e.g., 1024 bytes), by a word line size, or by another size that is supported by a host device.

The threshold comparator 220 is configured to receive a metric 230 from the parser 164 and to provide a result 232 to the parser 164 based on a comparison using one or more threshold(s) 240. For example, the metric 230 may indicate of an amount of time that has elapsed between a most recently received instruction and a next-most recently received instruction. The threshold comparator 220 may be configured to compare the metric 230 to a start delay 242 and to generate a value of the result 232 indicating whether the metric 230 satisfies (e.g., is greater than or equal to) the start delay 242. As another example, the metric 230 may indicate an amount of time that has elapsed since a last instruction was received. The threshold comparator 220 may be configured to compare the metric 230 to an end delay 244 and generate a value of the result 232 indicating whether the metric 230 satisfies (e.g., is greater than or equal to) the end delay 244. As another example, the metric 230 may indicate a length of a received address sequence, such as a count of instructions in the sequence 202 of received addresses starting with a first address of the sequence 202. The threshold comparator 220 may be configured to compare the metric 230 to a length 246 and generate a value of the result 232 indicating whether the metric 230 satisfies (e.g., is greater than or equal to) the length 246.

The clock 222 may be responsive to the parser 164 to initiate one or more timers or to otherwise enable a temporal duration between two events to be determined. For example, the clock 222 may receive an indication from the parser 164 that an instruction has been received and the clock 222 may set a timer to count from receipt of the indication. After a next instruction has been received by the parser 164, the parser 164 may send a signal to the clock 222 to cause the clock 222 to provide a value of the timer to the parser 164 and to reset and restart the timer.

The counter 224 may include circuitry configured to reset a counter value in response to receiving a reset signal and to increment the counter value in response to receiving an increment signal. For example, the counter 224 may receive a reset signal from the parser 164 in response to the parser 164 identifying a start of an address sequence and may receive an increment signal from the parser 164 in response to each subsequent address of the sequence received by the parser 164. The counter value may indicate a length of the address sequence (e.g., a count of addresses in the sequence) and may be readable by or otherwise accessible to the parser 164 to determine whether an address sequence satisfies the length 246.

During operation, the address parser/generator 252 may receive the instructions 250 and may generate the sequence 202 of received addresses, illustrated as including addresses in the sequence: X0, X1, X2, X3, Y0, and Y1. The sequence 202 of received addresses may be provided to the parser 164. The parser 164 may parse the sequence 202 of received addresses to determine a starting address 210.

For example, the parser 164 may receive an indication 234 of a boot event at the data storage device 102. The parser 164 may identify the first address that is received at the parser 164 after receiving the indication 234 of a boot event (e.g., the address X0) as the starting address 210. As another example, the parser 164 may identify an address as the starting address 210 in response to a first delay 204 exceeding a first time threshold. The first delay 204 may correspond to a length of time that no read instructions are received from a host device before receiving the first address (e.g., the address X0). To illustrate, upon receiving each address, the parser 164 may send a signal to the clock 222 to reset a timer. When the address X0 of the sequence 202 of received addresses is received after the first delay 204, the parser 164 may send a signal to the clock 222 that causes the timer value to be provided to the threshold comparator 220 as the metric 230 and that causes the clock 222 to reset the timer. The threshold comparator 220 may compare the metric 230 to the start delay 242 and may generate the result 232 indicating whether the first delay 204 exceeds the start delay 242. In response to the result 232 indicating that the first delay 204 exceeds the start delay 242, the parser 164 may determine that the address X0 is the starting address 210.

The parser 164 may continue to parse the sequence 202 of received addresses to generate a sequence 290 as a subset of the sequence 202 of received addresses beginning with the starting address 210 and ending with an ending address 212. The parser 164 may identify a particular address of the sequence 202 of received addresses as the ending address 212. For example, the parser 164 may compare a timer value associated with delays between received addresses in the sequence 202 of received addresses to determine whether any of the delays exceeds the end delay 244. Each delay between received addresses may be read from the clock 222 and provided to the threshold comparator 220 via the metric 230, such as described with respect to determining the starting address 210. Upon determining that a delay 206 between an address X3 and a next sequential address Y0 exceeds the end delay 244, the parser 164 may identify the address X3 as the ending address 212 to end the sequence 290.

As another example, the parser 164 may increment a counter value at the counter 224 for each address of the sequence 202 of received addresses beginning with the starting address 210 and may identify the ending address 212 based on the counter value equaling the length 246. For example, the counter value may be provided to the threshold comparator 220 via the metric 230 for comparison to the length 246. A result of the comparison may be provided to the parser 164 via the result 232.

The resulting sequence 290, beginning with the starting address 210 and ending with the ending address 212, may be provided to the comparator 166 of FIG. 1 for comparison to the stored address sequence(s) 162. In this manner, one or more sequences may be extracted from received addresses and provided to the comparator 166 for comparison to the stored address sequence(s) 162.

Although FIG. 2 illustrates that the indication 234 of a boot event and the start delay 242 can be used for determining a starting address of a sequence of addresses, in other implementations only one of the indication 234 of a boot event or the start delay 242 may be used. For example, the parser 164 may determine a boot sequence starting address as a first address that is received following the indication 234 of a boot event and may determine an ending address based on the end delay 244, or based on the length 246, or a combination thereof. As another example, the parser 164 may determine starting addresses based on the first delay 204 and may not be configured to receive the indication 234 of a boot event. The parser 164 may identify sequences based on comparisons to the start delay 242 independent of whether the sequences follow a boot event. The clock 222 may be configured to initialize a timer value that exceeds the start delay 242 (or that is recognized as an initialization value, such as a 0 value, a maximum value, or a negative value, as illustrative examples) upon power-up so that boot sequences are also identified by the parser 164. By determining starting addresses based on the first delay 204, blocks storing operating system overlays and frequently-loaded applications, such as in consumer devices that keep re-loading overlays for lack of RAM capacity, may be protected although the blocks may not be read based on a boot event. Such frequently accessed sequences of addresses may be detected and stored, in addition to detecting a sequence following a boot event.

Figure 3:
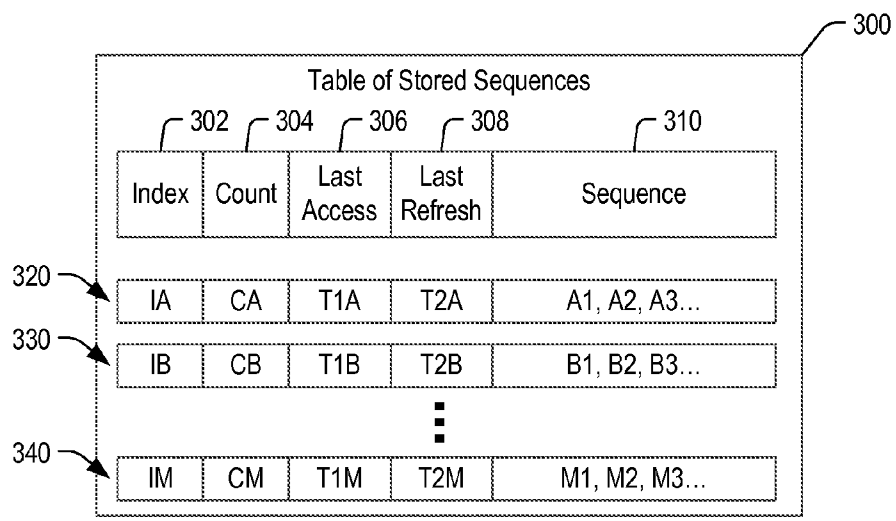
FIG. 3 is a general diagram that illustrates a table of stored address sequences that may be incorporated in the data storage device of FIG. 1.

FIG. 3 illustrates a particular embodiment of a table 300 of stored sequences that may be implemented in the data storage device 102 of FIG. 1 as the stored address sequence(s) 162. The table 300 of stored sequences includes multiple entries, such as a first entry 320, a second entry 330, and a third entry 340. Each entry includes multiple values, such as an index 302, a count 304, a last access indicator 306, a last refresh indicator 308, and a sequence 310. The controller 120 may maintain and update a copy of the table 300 of stored sequences in the non-volatile memory 104 in case of power loss and may load the copy of the table 300 of stored sequences to controller memory upon boot of the data storage device 102.

The count 304 indicates a number of times that comparing of the corresponding sequence 310 to a received sequence has resulted in a match at the comparator 166. For example, each time the comparator 166 determines that a received sequence of addresses matches the sequence 310 for a particular entry in the table 300 of stored sequences, the controller 120 may increment the value of the count 304 for the particular entry. Addresses that are most commonly read from the non-volatile memory 104 may be identified based on the corresponding value of the count 304. The count 304 may include a first value indicating a total count of read accesses since the entry was added to the table 300 of stored sequences, a second value indicating a count of read accesses since a most recent remedial action, such as the relocate command 176, has been performed based on repeated access to the sequence 310, or a combination thereof.

The last access indicator 306 may include an indication (e.g., a timestamp) of a last time a match was detected between the corresponding sequence 310 and a received sequence at the comparator 166. The last access indicator 306 may enable identification of one or more sequences of addresses that were previously accessed frequently (and that have a high count 304) but that are no longer frequently accessed. As another example, the last access indicator 306 may enable identification of one or more sequences of addresses that are relatively frequently accessed but that are relatively recent additions to the table 300 of stored sequences. The count 304 and the last access indicator 306 may be used to update entries in the table 300 of stored sequences according to a replacement policy implemented by the controller 120.

The last refresh indicator 308 may include an indication (e.g., a timestamp) indicating a most recent refresh of non-volatile memory 104 based on reading of the data corresponding to the sequence 310. To illustrate, the addresses A1, A2, A3 . . . in the sequence 310 in the first entry 320 may correspond to logical addresses that are requested for read access by the host device 130 of FIG. 1 on a recurring basis and that may be responsible for increased read disturb effects to data at nearby word lines (or anywhere within a same block) of the non-volatile memory 104. When a remedial action is performed for one or more addresses of the sequence 310, a value of the last refresh indicator 308 may be updated. For example, the last refresh indicator 308 may include multiple timestamps, with each timestamp corresponding to a logical address of the sequence, so that a remedial action (e.g., the relocate command 176) can be broken up into multiple portions and performed during periods of low activity, such as in a background process.

The memory management engine 168 may determine whether to perform the relocate command 176 at least partially based on the last refresh indicator 308, such as by comparing an elapsed time since last refresh to a read disturb time threshold. As another example, the memory management engine 168 may determine whether to perform the relocate command 176 at least partially based on a comparison of the last refresh indicator 308 and the last access indicator 306.

The embodiments illustrated in FIGS. 1-3 may enable protection of the blocks in the non-volatile memory 104, such as blocks containing operating system code, against read disturb effects by enabling the controller 120 to automatically "learn" the location of such blocks. Identifying frequently-read blocks can be achieved by having firmware in the controller 120 monitor the sequence of addresses read by the host device 130 immediately following power-up or reset. The sequence of read addresses following each boot may be expected to be unvarying or substantially unvarying following each boot event. By tracking the sequence of read addresses following each boot event and keeping the sequence of read addresses in the non-volatile memory 104 for cross-session persistence, the controller 120 can determine which blocks to protect.

The addresses received from the host device 130 may be logical addresses that are translated into physical addresses by the controller 120. Therefore, the list of blocks to protect may be specified with logical block numbers. The controller 120 (e.g., firmware implementing the memory management engine 168) may manage moving of data corresponding to operating system/boot-accessed logical addresses into different physical locations to prevent physical blocks from experiencing too high of a count of read cycles between successive write cycles.

Moving code stored at the identified logical addresses (e.g., operating system code) to different physical blocks may be performed by the flash management engine 168 in a manner similar to moving data during garbage collection or wear leveling. In some implementations, the host device 130 continues requesting data read from logical addresses and is not aware of the changes in the corresponding physical addresses. Logical-to-physical translation tables maintained by the controller 120 may be updated to reflect the relocation of frequently read data while keeping the relocation invisible to the host device 130.

The controller 120 may determine where a list of blocks to protect ends (e.g., where a boot sequence ends) by determining where the multiple sequences generated in multiple boot events start to diverge from each other. Alternatively, the determination of where a sequence ends can be based on timing considerations. For example, when there is a time gap that is larger than a predetermined value (e.g., the second delay 206 exceeds the end delay 244), the controller 120 may assume the boot sequence ended and the host device 130 is waiting for user input. A sequence determined by one or more of the above methods might include "true" operating system blocks and may also include applications or other software or data that is automatically launched and read by the host device 130 before stopping to wait for user input. As explained above, these non-operating system blocks may be handled in the same manner as operating system blocks and may benefit from the same level of protection against read disturb effects as the operating system blocks.

The systems and techniques of FIGS. 1-3 may provide read disturb resistance of the non-volatile memory 104 even in a case in which most boot events of the data storage device 102 are not boot events of the host device 130. In such case, a similarity between the boot sequences occurring when the host device 130 also boots may be detected. After the data storage device 102 has experienced a few “true” host boot events, the boot sequence may be recorded in the stored address sequence(s) 162 and tracked by the controller 120 and may not be disturbed by “false” boot events that might appear in-between the “true” boot events. For example, the stored address sequence(s) 162 may include one sequence corresponding to addresses requested following a “true” boot event and may include another sequence corresponding to addresses requested following a “false” boot event.

Embodiments that detect and store a single boot sequence as the stored address sequence(s) 162 by detecting host access to repeating sequences at boot time may be useful in finding out and protecting the blocks used for operating system boot and for applications automatically loaded at boot time. However, such embodiments may not automatically protect blocks storing operating system overlays and frequently-loaded applications, such as in consumer devices that keep re-loading overlays for lack of RAM capacity. Other embodiments may therefore detect and store sequences of addresses frequently requested by the host device 130 (in addition to detecting the sequence following a boot event), such as described with respect to FIG. 2.

For example, the controller 120 may identify the start of potential reading sequences based on time considerations. To illustrate, a read request after a time gap larger than a predetermined value may indicate the beginning of a new sequence and will be kept, illustrated as the address X1 received after the first delay 204, when the first delay 204 exceeds the start delay 242. An end of the sequence may be determined when another gap in time occurs (e.g., by detecting that the second delay 206 exceeds the end delay 244) or when a predetermined length is reached (e.g., when a value of the counter 224 exceeds the length 246). The controller 120 may maintain a list of detected reading sequences, such as in the table 300 of stored sequences. Upon the detection of a sequence, the controller 120 may compare the detected sequence to the sequences in the table 300, such as via the comparator 166. If the detected sequence is already in the table 300, its count 304 may be incremented. If the detected sequence is not in the table 300, the detected sequence may be added to the table 300. If the table 300 does not have capacity for another entry, an existing entry in the table 300 may be selected for deletion to make room for adding the detected sequence to the table 300 of stored sequences, as described in further detail below.

The table 300 may include multiple fields (e.g., time of last detection, count, length of sequence, etc.) and may be stored in non-volatile memory 104. The table 300 may be cached in a RAM of the controller 120 for increased speed of access to the table 300 by the controller 120. The controller 120 may apply flash management techniques (e.g., periodically storing updates of RAM data to the non-volatile memory 104) for providing power-loss protection to the table 300 to prevent loss of data due to unexpected power losses.

In case the table 300 is full, a least recently used (“LRU”) policy (or a least recently updated policy, such as based on the last access indicator 306) may be used to select a table entry for deletion. Alternatively, a deletion policy may be based on the counts 304 associated with each of the existing sequences. However, to accommodate a new sequence that has recently become very common due to a latest usage scenario of the host device 130, deletion of entries may be based on additional statistics, such as a length of time since an entry was last accessed (e.g., the last access indicator 306).

Once sequences of logical addresses (which determine sequences of blocks) prone to read disturb are determined, either from a boot event or from a frequent sequences table, the controller 120 may initiate one or more remedial actions to protect the determined blocks (i.e., the blocks corresponding to the determined sequences).

Protecting the determined blocks may include “refreshing” the blocks by copying the content of the blocks to other physical blocks and updating any logical-to-physical translation tables to reflect the new locations. Alternatively, protecting the blocks may be implemented by carrying out a “health check” for each of the blocks in a “suspects list”. The health check may be performed by reading either the full block, a portion of the block, or a sample of a few pages or a single page of the block, and determining a number of errors reported by the ECC engine 122. If a measured error rate of a block is found to exceed a predetermined limit, then the data of the block may be moved to one or more different blocks. If the error rate is below the threshold, no action may be taken (e.g., no data is moved) and the error rate may be re-measured during a next “health check”. Implementing the read disturb protection by first doing a health check may avoid unnecessarily moving data to conserve flash write/erase cycles and processing resources.

In response to determining that copying of data to another block is to be performed, the copying can be either carried out immediately or scheduled for later execution as part of a general mechanism that may be used by the memory management engine 168, such as for copying blocks for garbage collection, wear leveling and other flash management activities. Copying of data from the detected block may be performed during an idle time or while processing host commands, or during a shutdown time (e.g., when the data storage device 102 is notified of a shutdown taking place and given time for “nicely” closing down) or during a device power-up time.

A decision of when to schedule read disturb protection operations for detected repeating address sequences may be based on the counts 304 associated with the sequences in the table 300. For example, a protection activity for the blocks in a sequence may be triggered in response to the count 304 for the sequence equaling (or exceeding) an integral multiple of a threshold, such as 1,000. As another example, the protection activity may be triggered depending on time, such as based on calendar time (such as in implementations where the controller 120 has access to calendar time) or based on accumulated power-on time of the data storage device 102. For example, a protection activity may be triggered for the blocks of a sequence once the time interval since its latest protection activity equals or exceeds a threshold, such as three months of calendar time or three months of accumulated power-on time.

Protection activity may be performed for all blocks of a detected sequence as a single operation, or the protection activity may be performed in multiple operations that each move data from one block or a few blocks. Single-operation and multiple-operation implementations may be applied to both "health checks" and data refreshing operations.

It should be understood that the systems and methods described herein may be implemented in addition to implementing conventional read disturb protection, such as read scrubbing. For example, read scrubbing may be performed during an idle period and may include systematically reading data from a block of the non-volatile memory 104, comparing a detected number of errors to a threshold, and (if the detected number of errors exceeds the threshold) refreshing the block by copying contents of the block to another block and releasing the block to a free blocks pool. Read scrubbing may be operated at a reduced rate to reduce the amount of processing resources consumed by the read operations performed during read scrubbing. Blocks more prone to read disturb errors due to storing operating system code and other frequently read sequences may be protected according to the techniques described with respect to FIGS. 1-3, while read scrubbing may be implemented to check and protect other blocks (or all blocks) of the non-volatile memory 104.

Figure 4:
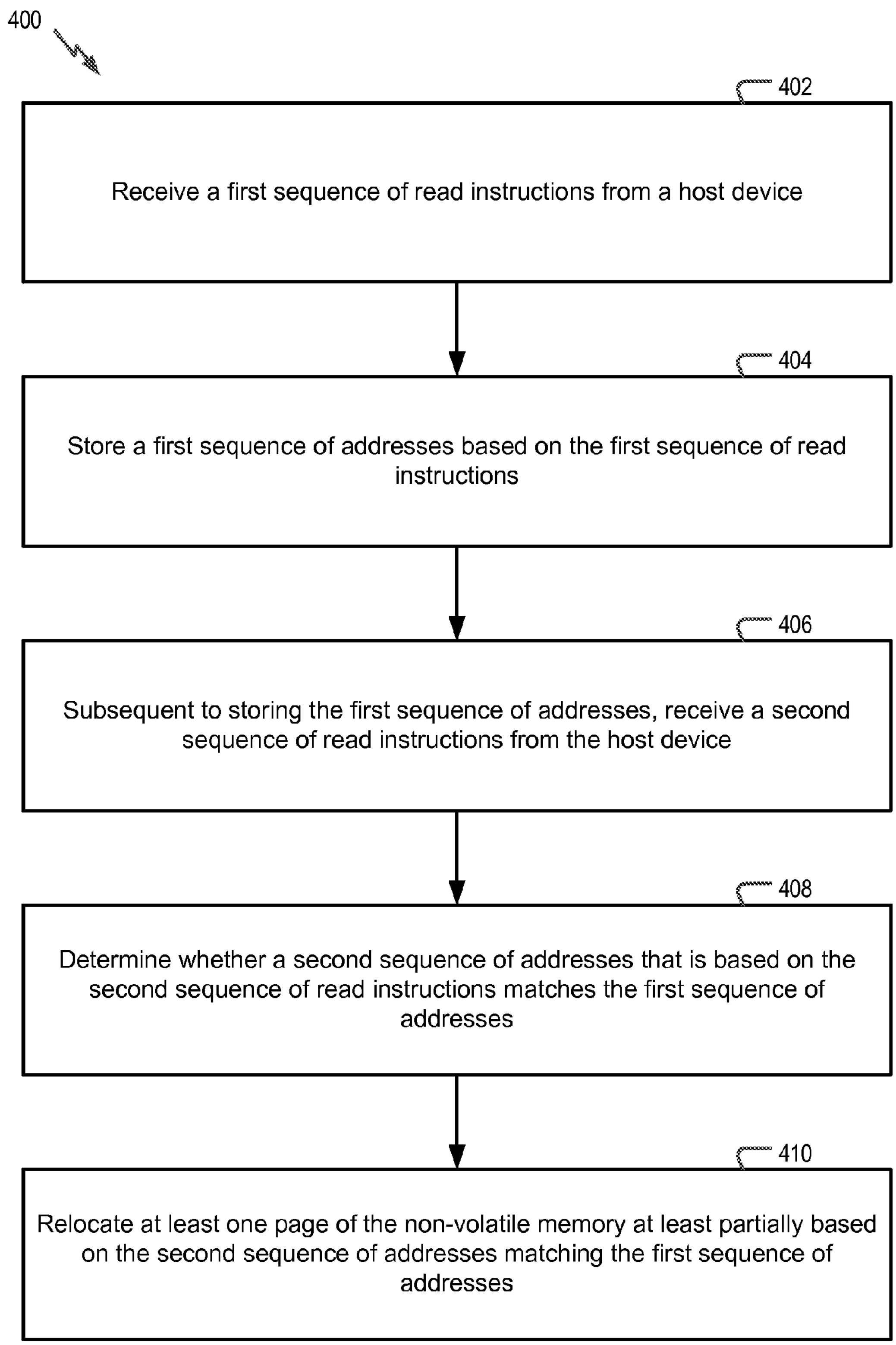
FIG. 4 is a flow chart of a particular illustrative embodiment of a method of relocating data based on matching address sequences.

FIG. 4 illustrates a method 400 that may be performed to reduce read disturb. The method 400 may be performed in a memory device including a controller and a non-volatile memory. For example, the method 400 may be performed by the controller 120 of FIG. 1.

A first sequence of read instructions is received from a host device, at 402. The first sequence of read instructions may correspond to the first set of instructions 132 of FIG. 1. The first sequence of read instructions may be part of a sequence of read instructions that is received immediately after a boot event of the host device 130.

A first sequence of addresses based on the first sequence of read instructions may be stored, at 404. The first sequence of addresses may include logical addresses of data requested by the host device. Storing the first sequence of addresses may include identifying a first particular address received from the host device as a starting address of the first sequence of addresses. For example, the first particular address may be identified as the starting address in response to the first particular address being a first address that is received following a boot event at the memory device, such as a first address received by the parser 164 after the indication 234 of a boot event of FIG. 2. As another example, the first particular address may be identified as the starting address in response to a first delay exceeding a first time threshold. The first delay may correspond to a length of time that no read instructions are received from the host device before receiving the first particular address, such as the first delay 204 exceeding the start delay 242 of FIG. 2.

Storing the first sequence of addresses may include identifying a second particular address received from the host device as an ending address of the first sequence of addresses. For example, the second particular address may be identified as the ending address in response to a second delay exceeding a second time threshold, the second delay corresponding to a length of time that no read instructions are received from the host device after receiving the second particular address. To illustrate, the ending address 212 may be identified in response to the second delay 206 exceeding the end delay 244 of FIG. 2. As another example, the second particular address may be identified as the ending address in response to a number of addresses in the sequence of addresses from a beginning of the first sequence of addresses to the second particular address satisfying a sequence length threshold. To illustrate, the ending address 212 may be identified in response to a length of the sequence 290 equaling or exceeding the length 246. Although the starting address 210 is described as "a first particular address" and the ending address is described as "a second particular address," it should be clearly understood that the starting address 210 is not necessarily a sequentially first address (e.g., one or more addresses of the sequence 202 may precede the starting address 210, such as addresses received prior to the first delay 204) and that the ending address 212 is not necessarily a sequentially second address (e.g., multiple addresses may be sequentially received following the starting address 210 and prior to the ending address 212, such as the addresses X1 and X2 of the sequence 202).

The first sequence of addresses may be stored in a table of address sequences that is maintained by the controller, such as the table 300 of FIG. 3. The method 400 may also include comparing an identified sequence of addresses to one or more address sequences of the table. In response to determining that an address sequence of the table matches the identified sequence, a counter associated with the address sequence may be incremented, such as the count 304. In response to determining that no address sequence of the table matches the identified sequence, the identified sequence may be added to the table. For example, one or more entries of the table 300 may be dedicated for storing recently identified sequences to enable detection of previously undetected sequences of addresses that are repeatedly accessed. Maintaining the table may include selecting a particular address sequence of the table for deletion based on a length of time since a most recent update of the particular address sequence (e.g., based on the last refresh indicator 308), based on a counter value associated with the particular address sequence (e.g., based on the count 304), or a combination thereof.

Subsequent to storing the first sequence of addresses, such as in the table 300, a second sequence of read instructions is received from the host device, at 406. A determination is made whether a second sequence of addresses that is based on the second sequence of read instructions matches the first sequence of addresses, at 408. For example, the comparator 166 of FIG. 1 may generate the match indication 174 in response to determining a match between the first sequence of addresses 170 and the second sequence of addresses 172.

At least one page of the non-volatile memory is relocated at least partially based on the second sequence of addresses matching the first sequence of addresses, at 410. The at least one page of the non-volatile memory may be relocated from a block that is shared by another page corresponding to one of the addresses in the second sequence of addresses. For example, the second page 148 may be relocated from the first block 140 that is shared by the first page 146 to another block, such as the second block 142.

As an example, relocating the at least one page may be performed further in response to reading data from a block of the non-volatile memory that includes the at least one page and determining that a measurement of errors in the data satisfies an error threshold, such as determined by the ECC engine 122. As another example, relocating the at least one page may be performed further in response to determining that a counter value associated with the stored sequence exceeds a read count threshold, such as the count 304 of FIG. 3. As another example, relocating the at least one page may be performed further in response to a time measure associated with the stored sequence, such as the last refresh indicator 308, exceeding a time threshold. The time measure may correspond to an amount of calendar time since a most recent relocation of the at least one page or may correspond to an accumulated power-on duration of the memory device since a most recent relocation of the at least one page, as illustrative examples.

By relocating data based on matching sequences of read addresses, an amount of errors due to read disturb may be reduced. Reading of repeatedly accessed data, such as operating system data, overlays, and applications accessed in conjunction with boot events, may be tracked and appropriate remedial action taken. As a result, reliability of the non-volatile memory may be enhanced.

Although various components depicted herein are illustrated as block components and described in general terms, such components may include one or more microprocessors, state machines, or other circuits configured to enable the controller 120 of FIG. 1 to identify sequences of read addresses, compare the identified sequences to one or more stored sequences, and selectively initiate a remedial action when an identified sequence matches a stored sequence. For example, the parser 164, the comparator 166, and/or the memory management engine 168 may represent physical components, such as hardware controllers, state machines, logic circuits, or other structures, to enable the parser 164, the comparator 166, and/or the memory management engine 168 of FIG. 1 to perform as described with respect to FIG. 1.

The controller 120 may be implemented using a microprocessor or microcontroller that may be programmed to identify sequences of read addresses by parsing read addresses from received read instructions or incrementing an address counter corresponding to read instructions. The microprocessor or microcontroller may be programmed to compare the identified sequences to one or more stored sequences by comparing a sequentially first address in the identified sequence to a sequentially first address in the stored sequence, comparing a sequentially second address in the identified sequence to a sequentially second address in the stored sequence, etc., and setting a first bit value when each address comparison indicates a match or setting a second bit value when any of the address comparisons does not indicate a match. The microprocessor or microcontroller may be programmed to selectively initiate a remedial action when an identified sequence matches a stored sequence by providing a logical address of the identified sequence to a logical-to-physical translation table to retrieve a corresponding physical address, determining an address of a block that includes the physical address by parsing a high-order set of bits (e.g., 11 bits for a 2,048 block memory) of the physical address and using the high-order set of bits as the block address, and initiating a copy of data from one or more pages having the block address.

In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be attached or embedded within one or more host devices, such as within a housing of a host communication device. In another embodiment, the data storage device 102 may be implemented in a portable device configured to be selectively coupled to one or more external devices. The data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:

in a memory device including a controller and a non-volatile memory, performing:

receiving a first sequence of read instructions from a host device;

storing a first sequence of addresses based at least partially on the first sequence of read instructions;

subsequent to storing the first sequence of addresses, receiving a second sequence of read instructions from the host device;

comparing a second sequence of addresses to the first sequence of addresses, the second sequence of addresses based at least partially on the second sequence of read instructions; and initiating a data move operation based at least partially on a result of the comparing indicating that the second sequence of addresses matches the first sequence of addresses.

2. The method of claim 1, wherein:

the first sequence of read instructions is part of a sequence of read instructions that is received immediately after a boot event of the host device;

the comparing results in a determination that the second sequence of addresses matches the first sequence of addresses; and the controller increments a count associated with the first sequence of addresses in response to the determination that the second sequence of addresses matches the first sequence of addresses.

3. The method of claim 1, wherein a read disturb effect is reduced by storing the first sequence of addresses as an identified sequence of frequently read addresses, and wherein the data move operation includes relocating at least one page of the non-volatile memory from a block that is shared by a frequently read page corresponding to an addresses of the second sequence of addresses.

4. The method of claim 1, wherein storing the first sequence of addresses includes identifying a first particular address received from the host device as a starting address of the first sequence of addresses in response to the first particular address being an initial address that is received following a boot event at the memory device.

5. The method of claim 1, wherein addresses of pages corresponding to the first sequence of addresses are read at a first read frequency that is greater than an average read frequency at which pages of the non-volatile memory are read.

6. The method of claim 1, wherein a first particular address received from the host device is identified as a starting address of the first sequence of addresses in response to a first delay exceeding a first time threshold, the first delay corresponding to a length of time that no read instructions are received from the host device before receiving the first particular address.

7. The method of claim 1, further comprising identifying a particular address received from the host device as an ending address of the first sequence of addresses.

8. The method of claim 7, wherein the particular address is identified as the ending address in response to a delay exceeding a time threshold, the delay corresponding to a length of time that no read instructions are received from the host device after receiving the particular address.

9. The method of claim 7, wherein the particular address is identified as the ending address in response to a number of addresses of the first sequence of addresses from a beginning of the first sequence of addresses to the particular address satisfying a sequence length threshold.

10. The method of claim 1, wherein a count associated with the first sequence of addresses indicates a number of times that data corresponding to the first sequence of addresses has been read from the non-volatile memory since a most recent read disturb remedial action has been performed at the non-volatile memory.

11. A method comprising:

in a memory device including a controller and a non-volatile memory, performing:

receiving a first sequence of read instructions from a host device;

storing at least a first sequence of addresses in an address sequence data structure;

subsequent to storing the first sequence of addresses, receiving a second sequence of read instructions from the host device;

comparing an identified sequence of addresses based at least partially on the second sequence of read instructions to one or more address sequences of the address sequence data structure;

in response to determining that an address sequence of the address sequence data structure matches the identified sequence, relocating at least one page of the non-volatile memory and incrementing a counter associated with the address sequence; and in response to determining that no address sequence of the address sequence data structure matches the identified sequence, adding the identified sequence to the address sequence data structure.

12. The method of claim 1, wherein the first sequence of addresses is stored in a table of address sequences, and further comprising maintaining the table by selecting a particular address sequence of the table for deletion based on a length of time since a most recent update of the particular address sequence, based on a counter value associated with the particular address sequence, or a combination thereof.

13. The method of claim 1, wherein each address of the second sequence of addresses is compared to a corresponding address of the first sequence of addresses to determine whether the second sequence of addresses matches the first sequence of addresses.

14. The method of claim 1, wherein at least one page of the non-volatile memory is relocated based on:

reading data from a block of the non-volatile memory that includes the at least one page, and determining that a measurement of errors in the data satisfies an error threshold.

15. The method of claim 1, wherein the first sequence of addresses are is stored in an address sequences data structure, and further comprising:

in response to determining that an address sequence of the address sequence data structure matches the second sequence of addresses, relocating at least one page of the non-volatile memory and incrementing a counter value associated with the address sequence.

16. The method of claim 1, wherein at least one page of the non-volatile memory is relocated based on a count associated with the first sequence of addresses exceeding a read count threshold or a time measure associated with the first sequence of addresses exceeding a time threshold.

17. The method of claim 16, wherein the time measure indicates an amount of calendar time since a most recent relocation of the at least one page.

18. The method of claim 16, wherein the time measure indicates an accumulated power-on duration of the memory device since a most recent relocation of the at least one page.

19. A data storage device comprising:

a non-volatile memory; and a controller coupled to the non-volatile memory, wherein the controller is configured to store a first sequence of addresses based at least partially on a first sequence of read instructions received from a host device and, subsequent to storing the first sequence of addresses, to receive a second sequence of read instructions from the host device, to compare a second sequence of addresses to the first sequence of addresses, the second sequence of addresses based at least partially on the second sequence of read instructions, and to initiate a data move operation based at least partially on a result of the comparing indicating that the second sequence of addresses matches the first sequence of addresses.

20. The data storage device of claim 19, wherein:

the first sequence of read instructions is part of a sequence of read instructions that is received immediately after a boot event of the host device; and the controller is configured to change a count associated with the first sequence of addresses in response to determining that the second sequence of addresses matches the first sequence of addresses.

21. The data storage device of claim 19, wherein the controller is configured to relocate at least one page of the non-volatile memory from a block that is shared by another page corresponding to an addresses of the second sequence of addresses.

22. The data storage device of claim 19, wherein the controller is configured to identify a first address received from the host device as a starting address of the first sequence of addresses in response to the first address being an initial address that is received following a boot event.

23. The data storage device of claim 19, wherein the controller is configured to read addresses of pages corresponding to the first sequence of addresses at a first read frequency that is greater than an average read frequency of pages of the non-volatile memory.

24. The data storage device of claim 19, wherein the controller is configured to identify a first address received from the host device as a starting address of the first sequence of addresses in response to a first delay exceeding a first time threshold, the first delay corresponding to a length of time that no read instructions are received from the host device before receiving the first address.

25. The data storage device of claim 19, wherein the controller is configured to relocate at least one page of the non-volatile memory in response to determining that the second sequence of addresses matches the first sequence of addresses.

26. The data storage device of claim 19, wherein the controller is configured to identify an address received from the host device as an ending address of the first sequence of addresses in response to a delay exceeding a time threshold, the delay corresponding to a length of time that no read instructions are received from the host device after receiving the address.

27. The data storage device of claim 19, wherein the controller is configured to identify an address received from the host device as an ending address of the first sequence of addresses in response to a number of addresses of the first sequence of addresses from a beginning of the first sequence of addresses to the address satisfying a sequence length threshold.

28. The method of claim 11, wherein the address sequences data structure includes a table that is maintained by the controller.

29. The data storage device of claim 19, wherein the controller is configured to compare an identified sequence of addresses to one or more address sequences of a table that includes the first sequence of addresses and, in response to determining that an address sequence of the table matches the identified sequence, to increment a counter value associated with the address sequence or, in response to determining that no address sequence of the table matches the identified sequence, to add the identified sequence to the table.

30. The data storage device of claim 19, wherein:

the first sequence of addresses is stored in an address sequence data structure that is maintained by the controller, and the controller is configured to select an address sequence of the address sequence data structure for deletion based on a length of time since a most recent update of the address sequence, based on a counter value associated with the address sequence, or a combination thereof.

31. The data storage device of claim 19, wherein the first sequence of addresses includes logical addresses of data requested by the host device.

32. The data storage device of claim 19, wherein the controller is configured to relocate at least one page based on reading data from a block of the non-volatile memory that includes the at least one page and determining that a measurement of errors in the data satisfies an error threshold.

33. The data storage device of claim 19, wherein the controller is configured to relocate at least one page of the non-volatile memory based on determining that a counter value associated with the first sequence of addresses exceeds a read count threshold.

34. The data storage device of claim 19, wherein the controller is configured to relocate at least one page of the non-volatile memory based on a time measure associated with the first sequence of addresses exceeding a time threshold.

35. The data storage device of claim 34, wherein the time measure corresponds to an amount of calendar time since a most recent relocation of the at least one page or to an accumulated power-on duration of the data storage device since a most recent relocation of the at least one page.

36. The data storage device of claim 19, wherein the controller is configured to compare each address of the second sequence of addresses to a corresponding address of the first sequence of addresses to determine whether the second sequence of addresses matches the first sequence of addresses.

* * * * *